(12) United States Patent
Knoefler et al.

(10) Patent No.: US 7,875,516 B2
(45) Date of Patent: Jan. 25, 2011

(54) INTEGRATED CIRCUIT INCLUDING A FIRST GATE STACK AND A SECOND GATE STACK AND A METHOD OF MANUFACTURING

(75) Inventors: Roman Knoefler, Dresden (DE); Michael Specht, Munich (DE); Josef Willer, Riemerling (DE)

(73) Assignee: Qimonda AG, Munich (DE)

( * ) Notice: Subject to any disclaimer, the term of this patent is extended or adjusted under 35 U.S.C. 154(b) by 556 days.

(21) Appl. No.: 11/855,695

(22) Filed: Sep. 14, 2007

(65) Prior Publication Data

US 2009/0072274 A1 Mar. 19, 2009

(51) Int. Cl.
*H01L 21/8234* (2006.01)
(52) U.S. Cl. .............. 438/275; 438/201; 438/257; 257/E21.689
(58) Field of Classification Search ............ 438/275, 438/201, 211, 257, 258, 264; 257/E21.689
See application file for complete search history.

(56) References Cited

U.S. PATENT DOCUMENTS

| | | | |
|---|---|---|---|
| 6,037,222 A * | 3/2000 | Huang et al. ............. 438/257 |
| 6,281,050 B1 * | 8/2001 | Sakagami ................. 438/142 |
| 6,706,593 B1 | 3/2004 | Kodama | |
| 6,787,419 B2 | 9/2004 | Chen et al. | |
| 7,601,581 B2 | 10/2009 | Taniguchi et al. | |
| 2002/0008278 A1 * | 1/2002 | Mori ........................ 257/315 |
| 2002/0119615 A1 * | 8/2002 | Kim et al. ................. 438/201 |
| 2003/0042558 A1 | 3/2003 | Noguchi et al. | |
| 2004/0046185 A1 * | 3/2004 | Sashida .................... 257/200 |
| 2005/0035394 A1 * | 2/2005 | Mori ........................ 257/314 |
| 2005/0127456 A1 * | 6/2005 | Saito ........................ 257/390 |
| 2005/0186741 A1 * | 8/2005 | Roizin et al. ............. 438/275 |
| 2006/0145242 A1 * | 7/2006 | Takagi et al. ............. 257/315 |
| 2007/0184606 A1 * | 8/2007 | You et al. ................. 438/211 |
| 2008/0090351 A1 * | 4/2008 | Mokhlesi et al. .......... 438/257 |
| 2008/0128774 A1 * | 6/2008 | Irani et al. ................ 257/314 |

\* cited by examiner

*Primary Examiner*—David Vu
*Assistant Examiner*—Earl N Taylor
(74) *Attorney, Agent, or Firm*—Dicke, Billig & Czaja, PLLC

(57) ABSTRACT

An integrated circuit including a first gate stack and a second gate stack and a method of manufacturing is disclosed. One embodiment provides non-volatile memory cells including a first gate stack and a gate dielectric on a first surface section of a main surface of a semiconductor substrate, and a second gate stack including a memory layer stack on a second surface section. A first pattern is transferred into the first gate stack and a second pattern into the second gate stack.

19 Claims, 24 Drawing Sheets

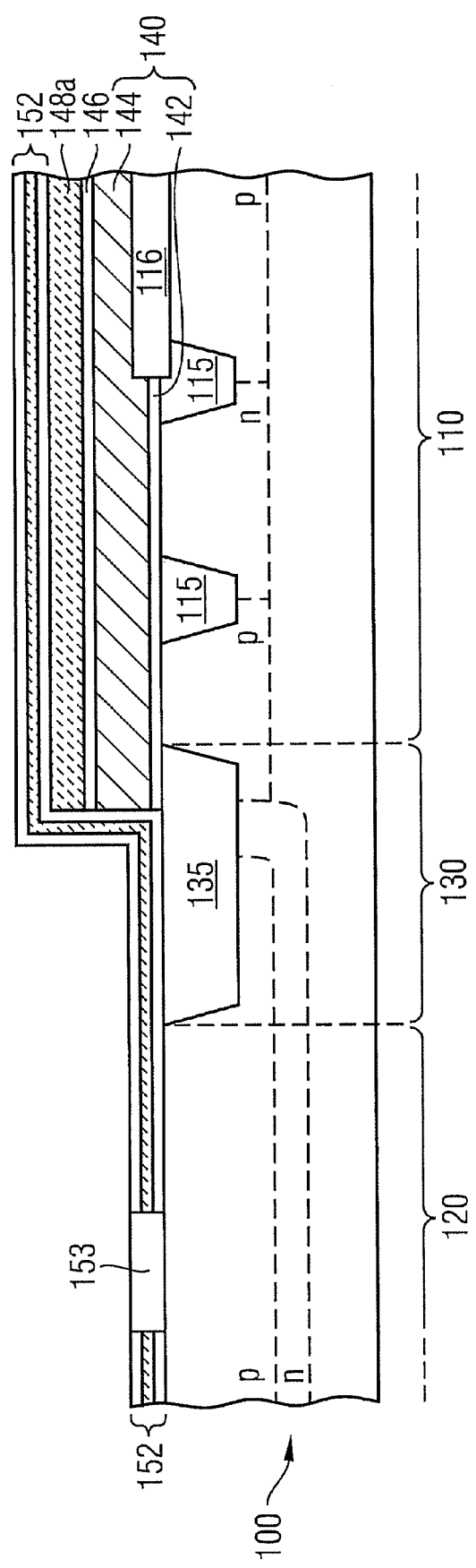

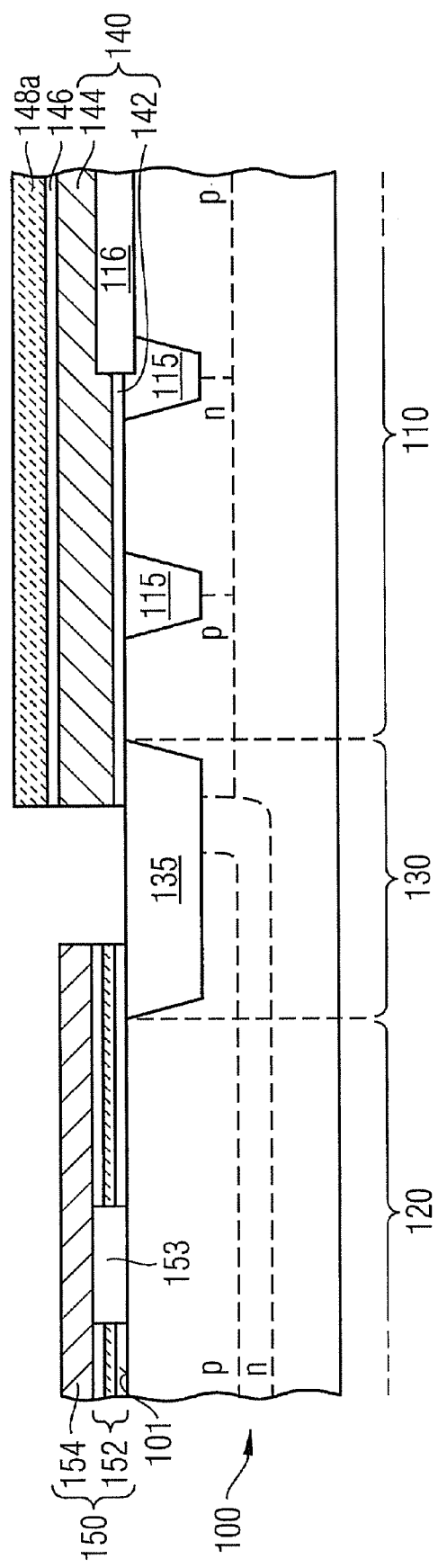

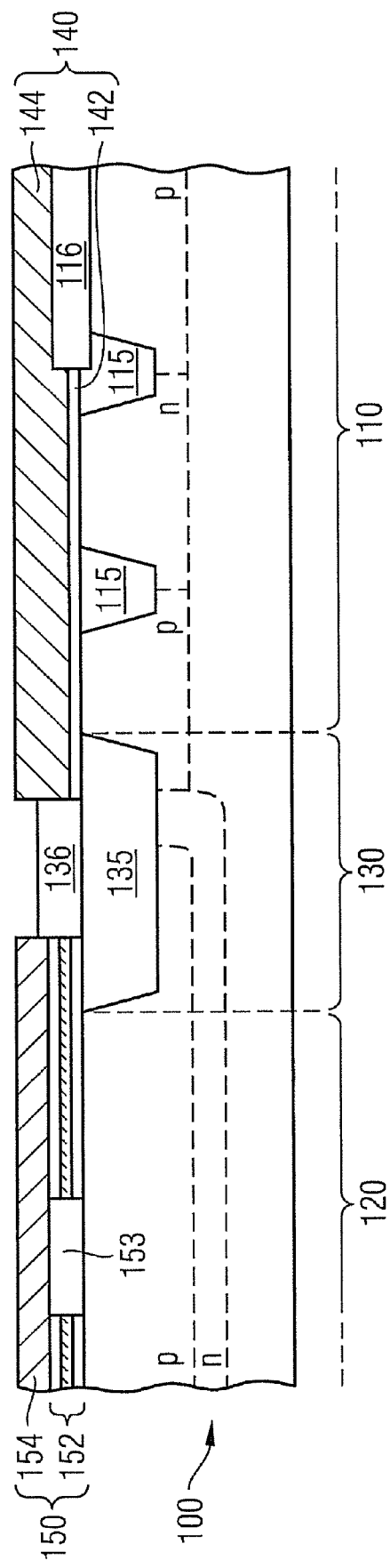

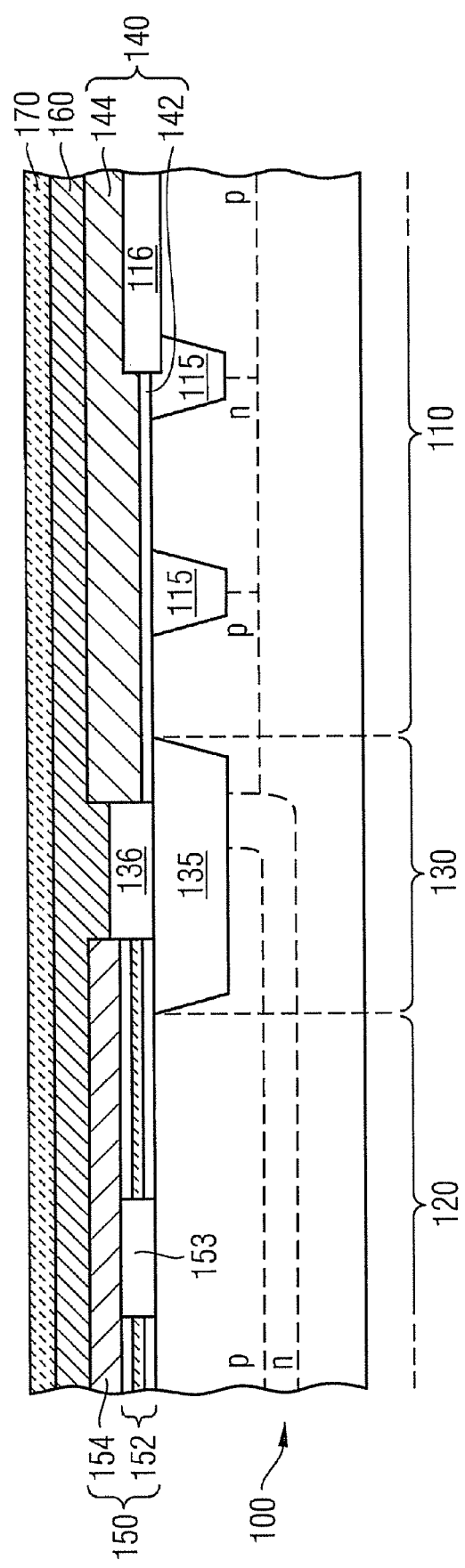

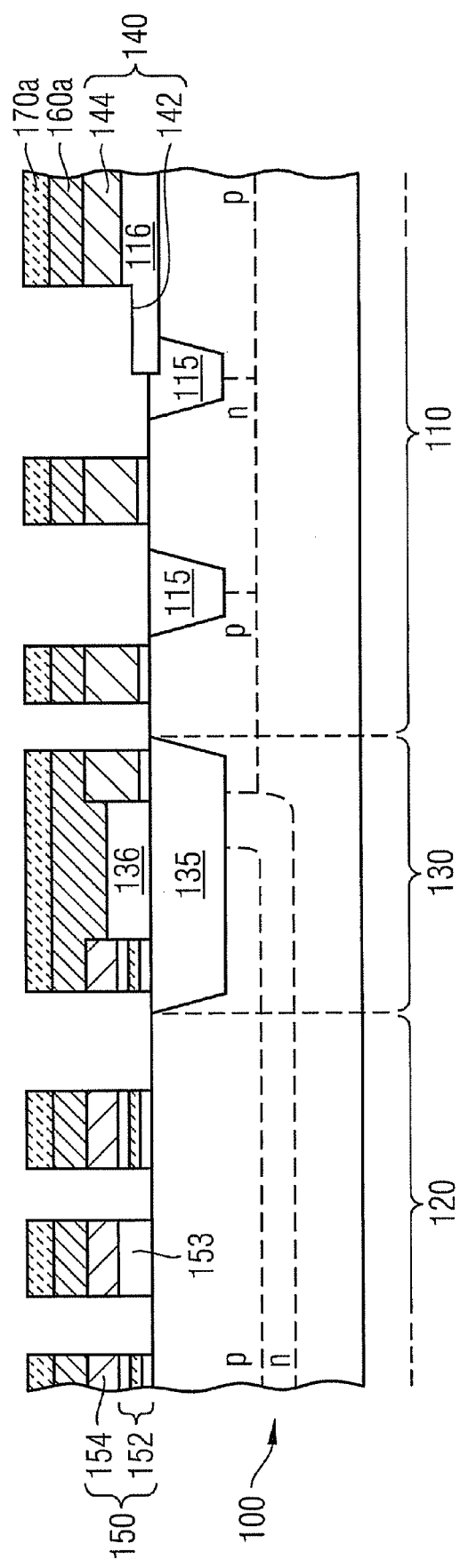

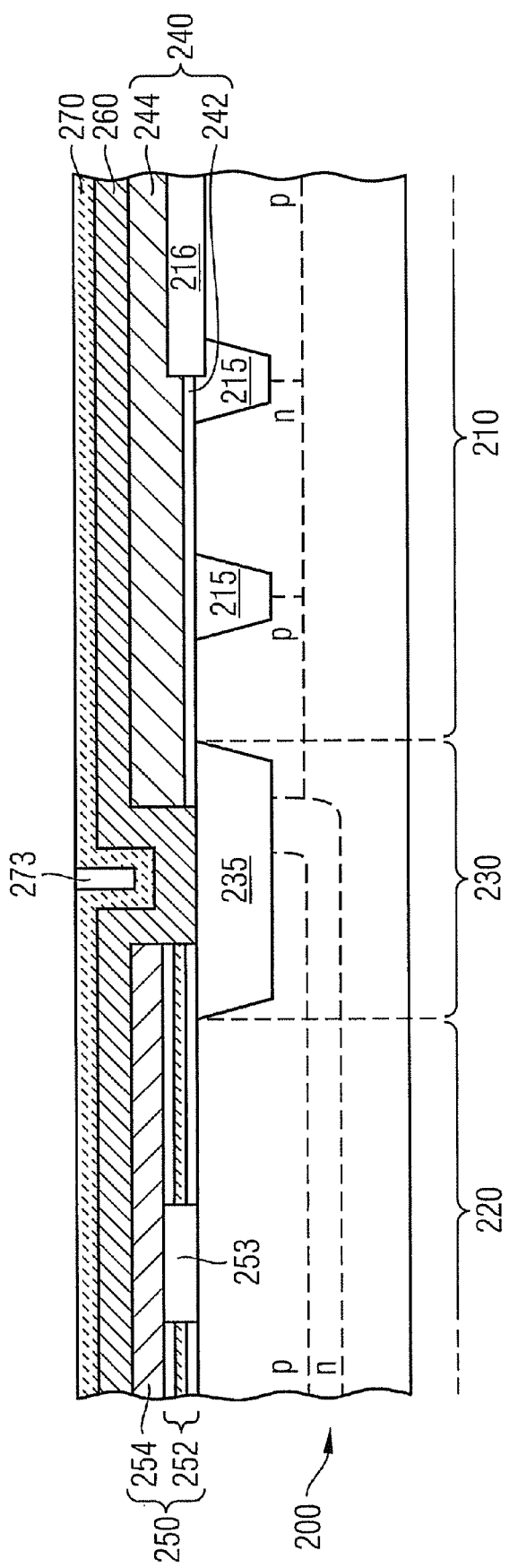

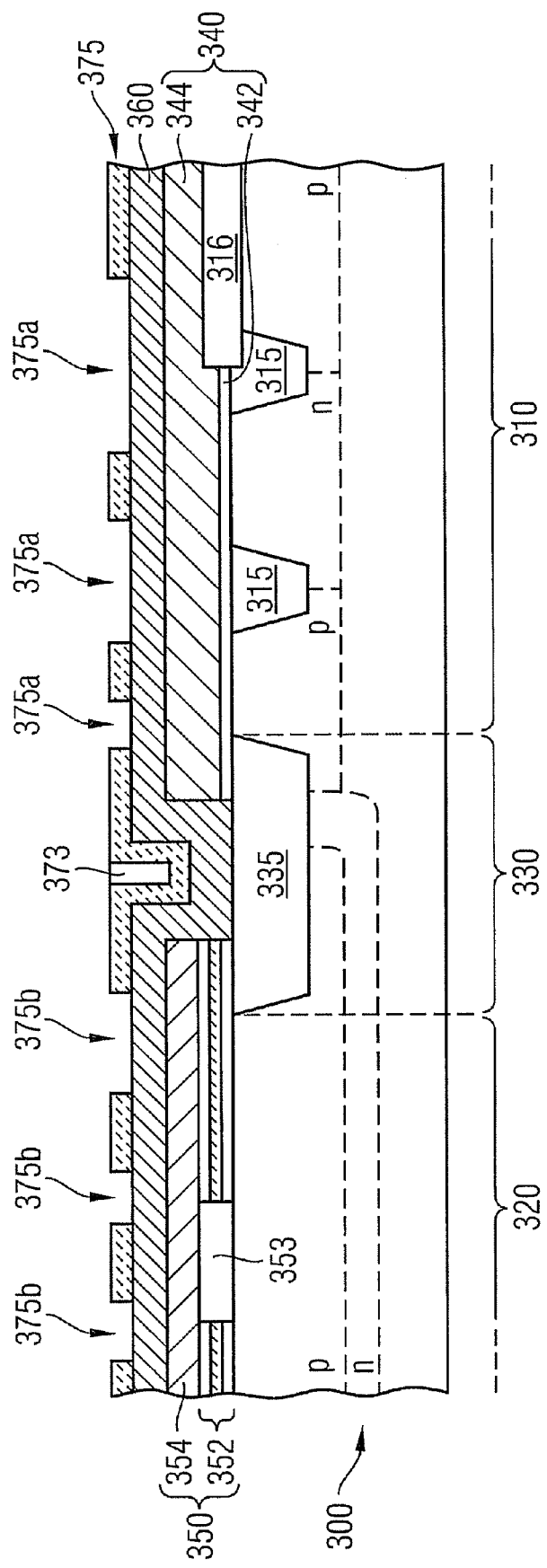

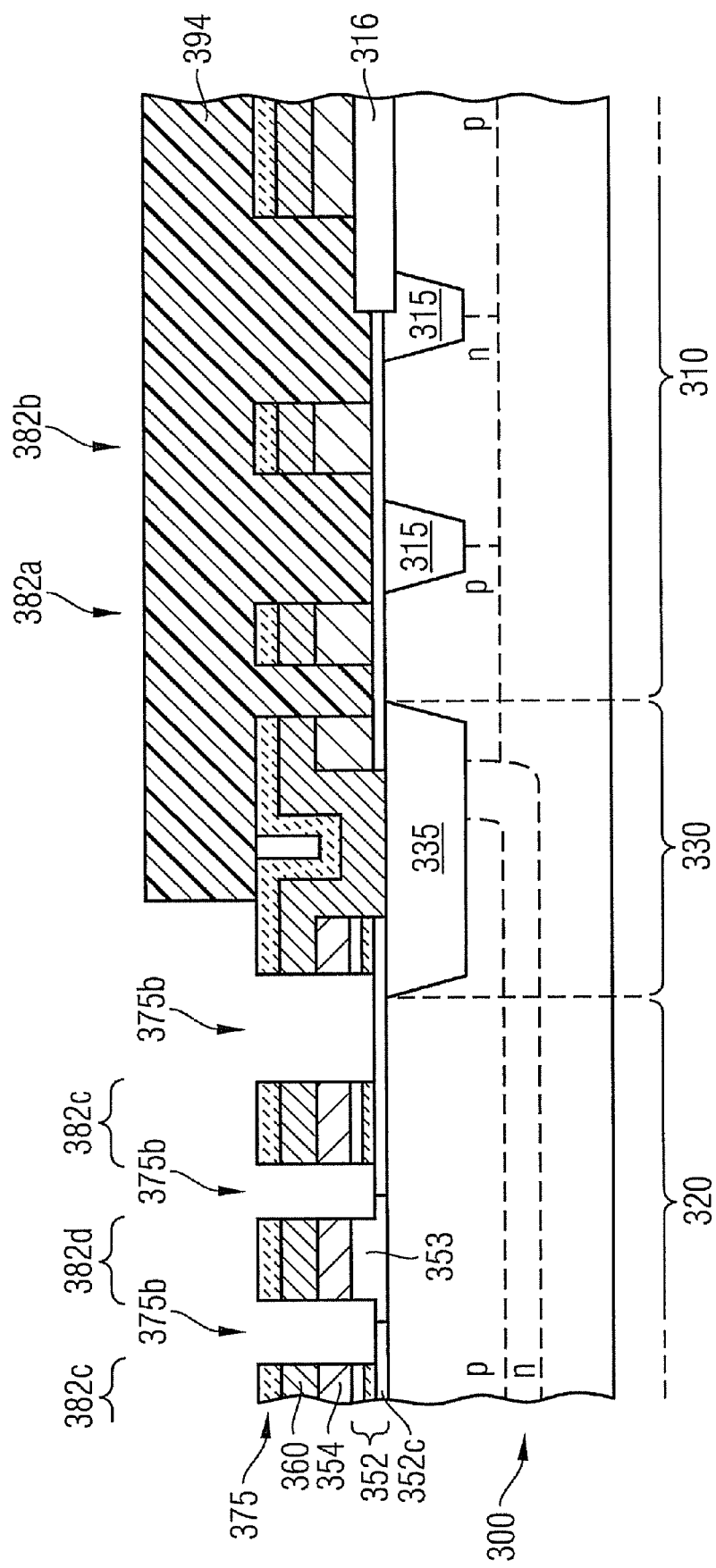

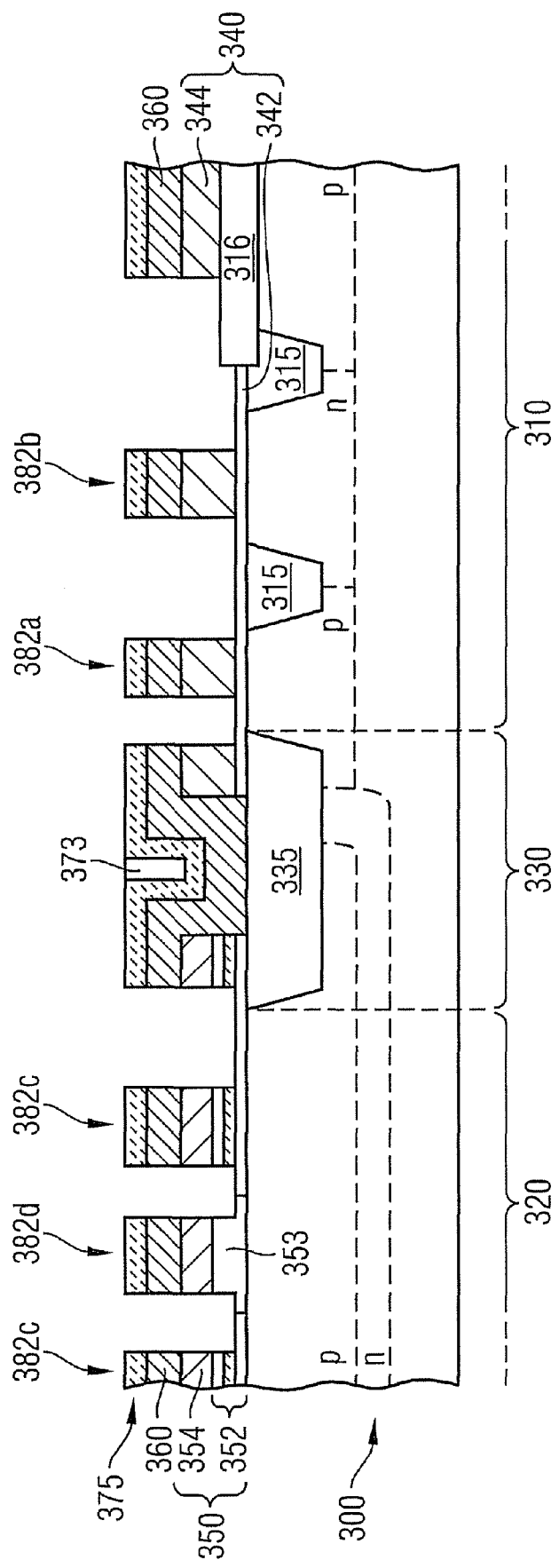

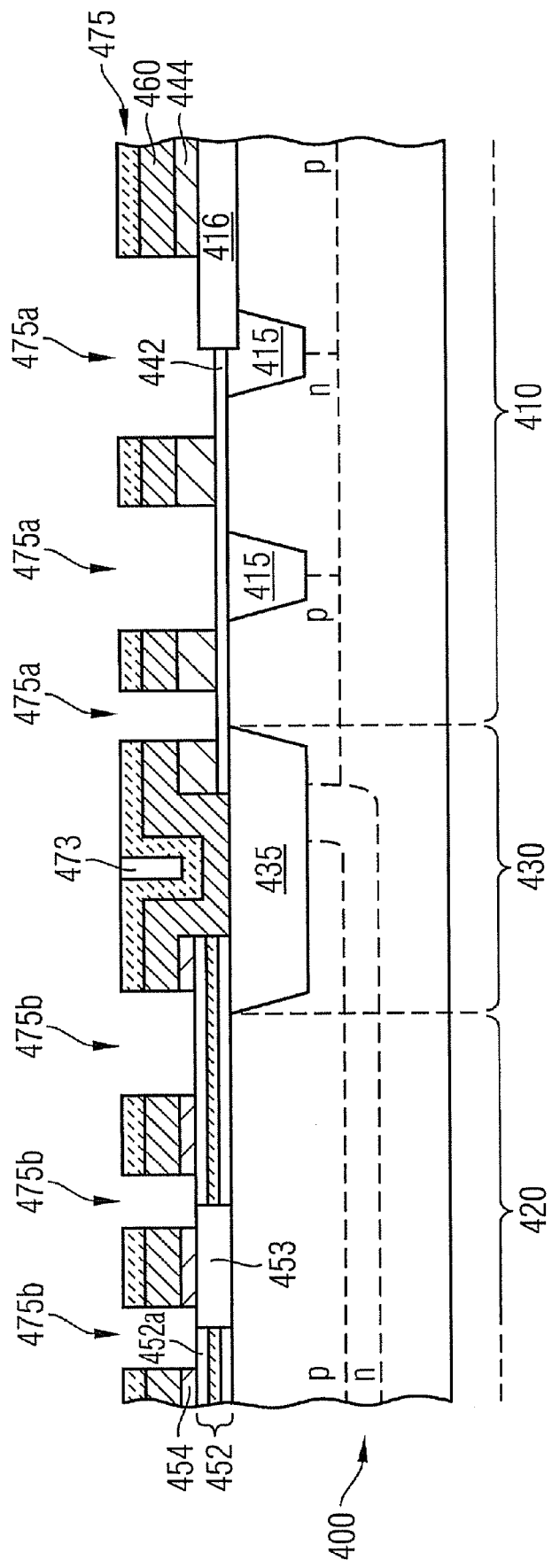

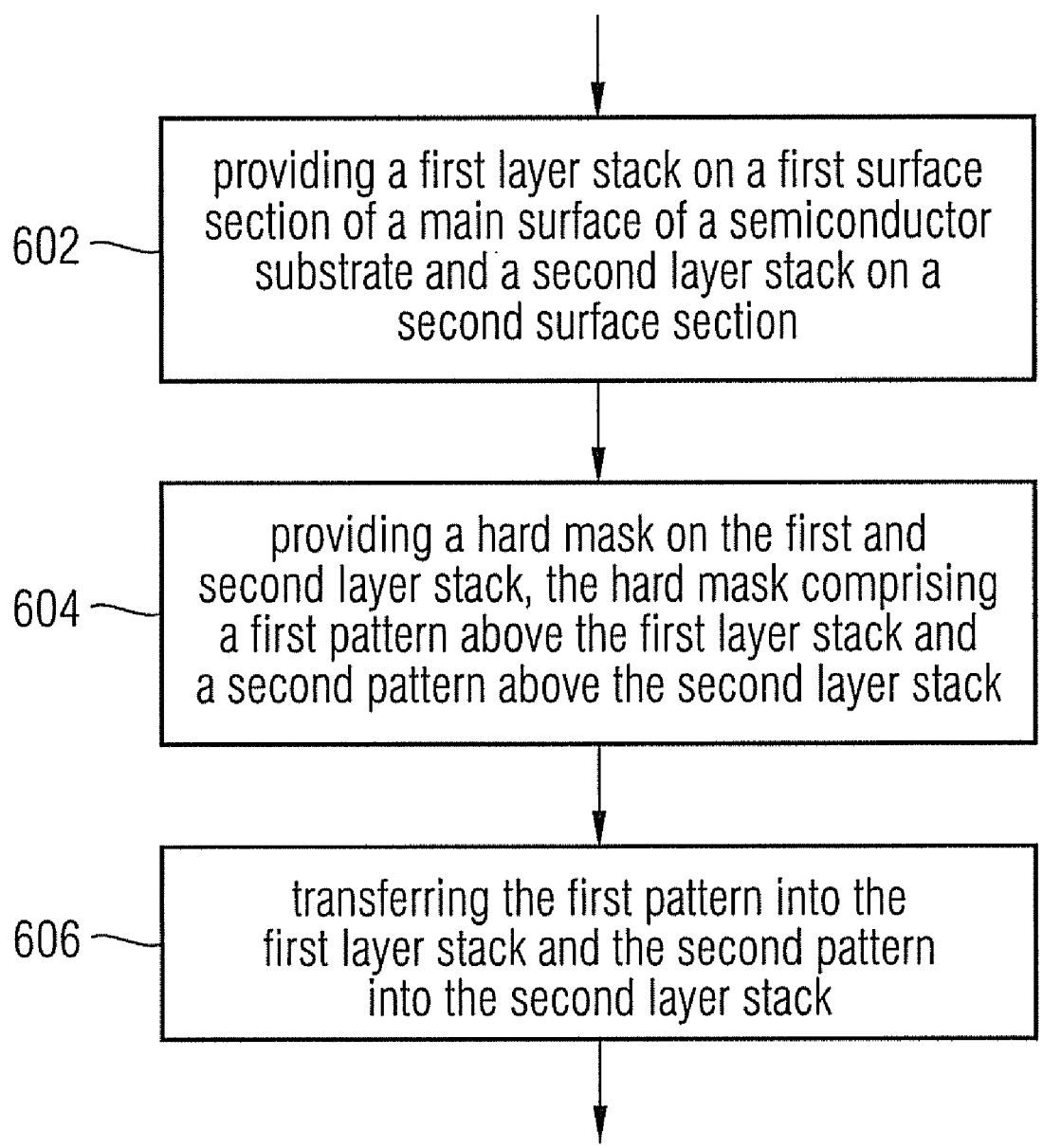

INTEGRATED CIRCUIT INCLUDING A FIRST GATE STACK AND A SECOND GATE STACK AND A METHOD OF MANUFACTURING

BACKGROUND

Charge trapping non-volatile memory cells are typically based on an n-MOSFET with the gate dielectric replaced by a memory layer stack having a charge trapping layer. Insulator layers separate the charge trapping layer from the gate electrode and the semiconductor channel region of the n-MOSFET.

In charge trapping memory cells of the TANOS structure (tantalum-alumina-nitride-oxide-semiconductor), the charge trapping layer is a silicon nitride layer. An alumina layer separates the silicon nitride layer from a tantalum nitride gate electrode. In a charge trapping memory cell of the SONOS structure (silicon-oxide-nitride-oxide-silicon) the charge trapping layer is a silicon nitride layer sandwiched between two silicon oxide layers, wherein the gate electrode is a polysilicon electrode.

In addition to the memory cells, an integrated circuit with memory functionality includes logic and interface circuits based upon cost-efficient CMOS transistors. Integration concepts are needed which allow integrating the fabrication of non-volatile memory cells into standard CMOS process flows. Due to the different materials used for the peripheral circuitry on one hand and the memory array on the other hand, the process requirements concerning the memory cells and the CMOS circuitry differ significantly from each other, for example, if the non-volatile memory cells include materials which are not used in the standard CMOS process flow, such as alumina or tantalum nitride.

A need exists for an integration scheme which combines the manufacture of both CMOS circuitry and non-volatile memory cells and which may be applied to different types of memory cells without essential modifications, for example with regard to the photolithographic masks.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1L illustrate a method of manufacturing an integrated circuit according to one embodiment including schematic cross-sectional views of a section of a substrate including a memory area and a peripheral area for illustrating, wherein a first gate stack in the peripheral area and a second gate stack in the memory area are patterned simultaneously and a gap between them is partially filled with an insulator.

FIG. 2 illustrates a schematic cross-sectional view of a section of an integrated circuit including a memory area and a peripheral area for illustrating a method of manufacturing an integrated circuit according to another embodiment, wherein a gap between a first gate stack in the peripheral area and a second gate stack in the memory area is partially filled with a conductive material.

FIGS. 3A to 3D illustrate schematic cross-sectional views of a section of an integrated circuit including a memory area and a peripheral area for illustrating a further method of manufacturing an integrated circuit according to another embodiment, wherein the first and the second gate stacks are patterned successively.

FIG. 4A to 4E illustrate schematic cross-sectional views of a section of an integrated circuit including a memory area and a peripheral area for illustrating a method of manufacturing an integrated circuit according to a further embodiment, wherein a memory layer stack in the memory area and a gate dielectric in the peripheral area are etched successively.

FIG. 6 illustrate a flowchart illustrating a method of manufacturing an integrated circuit including a memory area and a peripheral area according to another embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
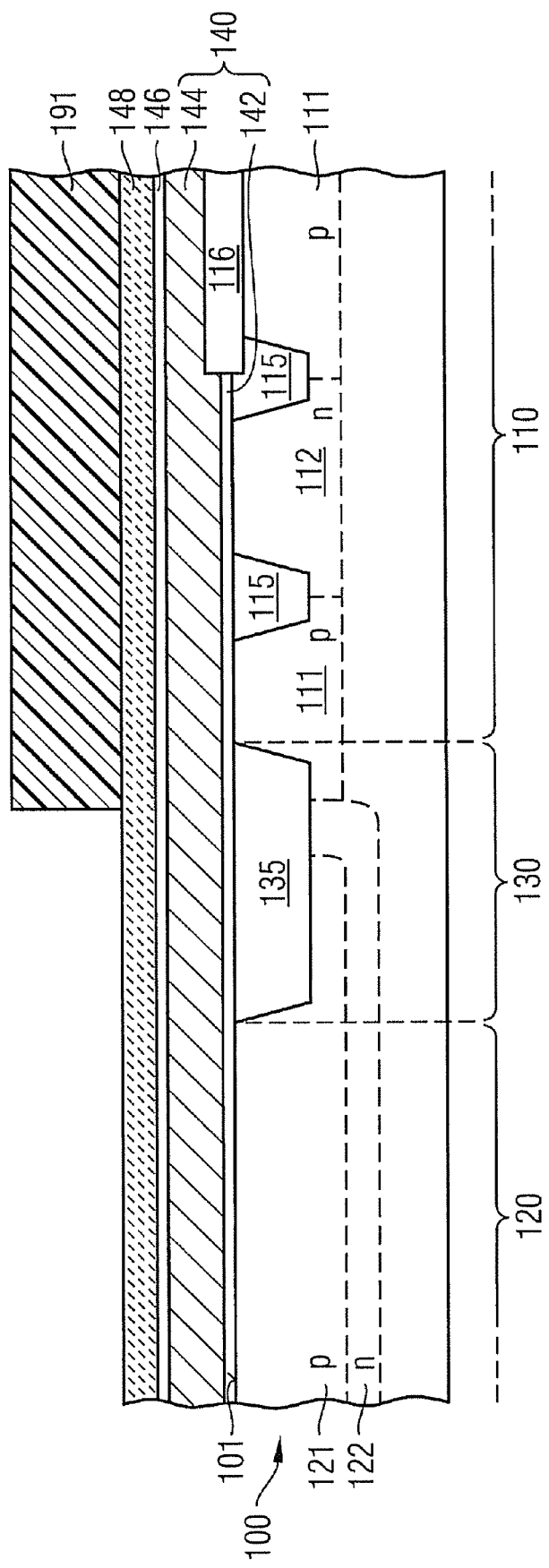

FIG. 1A illustrates a substrate 100 which may be, by way of example, a preprocessed single crystalline silicon wafer or a silicon-on-insulator wafer and which may include further doped and undoped sections or epitaxial semiconductor layers. In addition to the doped structures and insulator structures as illustrated, the substrate 100 may include further structures that have previously been fabricated.

In a memory area 120, the substrate 100 may include a first well 122 of a first conductivity type. Within the first well 122 a second well 121 of a second conductivity type, which is the opposite of the first conductivity type, may be formed. Both wells 121, 122 extend from a main surface 101 into the substrate 100. The wells 122, 121 may extend laterally over the whole memory area 120 and may extend into a transition area 130 of the substrate 100. In the peripheral area 110, sub-areas of the first conductivity type 112 and the second conductivity type 111 may alternate. The first conductivity type may be, for example, the n-type and the second conductivity type may be the p-type.

Within the transition area 130, the memory area 120 and the peripheral area 110 shallow trench isolation structures (STIs) may be buried in the substrate 100. The shallow trench isolations 135, 125, and 115 may be silicon oxide structures, by way of example. The shallow trench isolations 115 in the peripheral area 110 may separate active areas of CMOS transistors. The shallow trench isolations 125 in the memory area 120 may separate neighboring lines of memory cells from each other, for example neighboring NAND-strings or neighboring select transistors assigned to different NAND-strings. In the illustrated example, the shallow trench isolations 125 in the memory area 120 extend perpendicular to the gate structures and parallel to the illustrated cross-section. The shallow trench isolation 135 in the transition area 130 may decouple dummy gate structures disposed in the transition area 130 on the main surface 101 from the substrate 100 and may, for example, surround the memory area 120. In the peripheral area 110, additional gate oxides of a different thickness 116 may be provided, for example.

According to the illustrated embodiment, in the following, a first gate stack 140 will be provided on a first surface section of the main surface 101 and a second gate stack will be provided on a second surface section of the main surface 101, wherein the first surface section includes the peripheral area 110 and the second surface section includes the memory area 120.

As illustrated in FIG. 1A, a first gate stack 140 is provided that may comprise, for example, one or more gate dielectric 142 and a first gate conductor stack 144. The gate dielectric 142 may be, for example, a thermally grown silicon oxide layer. According to other embodiments, the gate dielectric 142 may be a deposited silicon oxide which may be nitrided afterwards or another oxide or silicon oxide of elements of the third or fourth group including oxides of rare earth, for example $Al_2O_3$, $HfO_2$, $HfSiO_2$, $ZrSiO_2$, $DySiO_2$ or another high-k material, or combinations of them. According to other embodiments, different gate dielectrics are provided in different sections of the main surface 101. The first gate conductor stack 144 may consist of or include one layer of any conductive material with a suitable work function, for example heavily n-doped polysilicon or a suitable metal or metal compound. According to other embodiments, the first gate conductor stack 144 may include further layers of other materials.

A first hard mask layer 148 may be provided above the first gate stack 140. The first hard mask layer 148 may be a layer of a material with high etch selectivity against the materials of the first gate conductor stack 144 and the gate dielectric 142, for example silicon nitride or carbon. A first liner, which is denominated as etch stop liner 146 in the following, may be provided between the first gate conductor stack 144 and the first hardmask layer 148. Though denominated as etch stop liner 146, the etch stop liner 146 may be effective as stress relief or stress release liner as well. According to further embodiments, the etch stop liner 146 may act as a stress relief liner mainly or exclusively, despite its denomination. The first etch stop liner 146 may be, for example, a silicon oxide liner or a liner of any other material with high etch selectivity against the material of the first hard mask layer 148. A first photoresist layer or layer system may be deposited on the first hard mask layer 148 and may be patterned by photolithographic techniques to form a first block mask 191 that covers the peripheral region 110 essentially completely and that may also cover a section of the transition area 130 adjacent to the peripheral area 110.

Figure 1B:
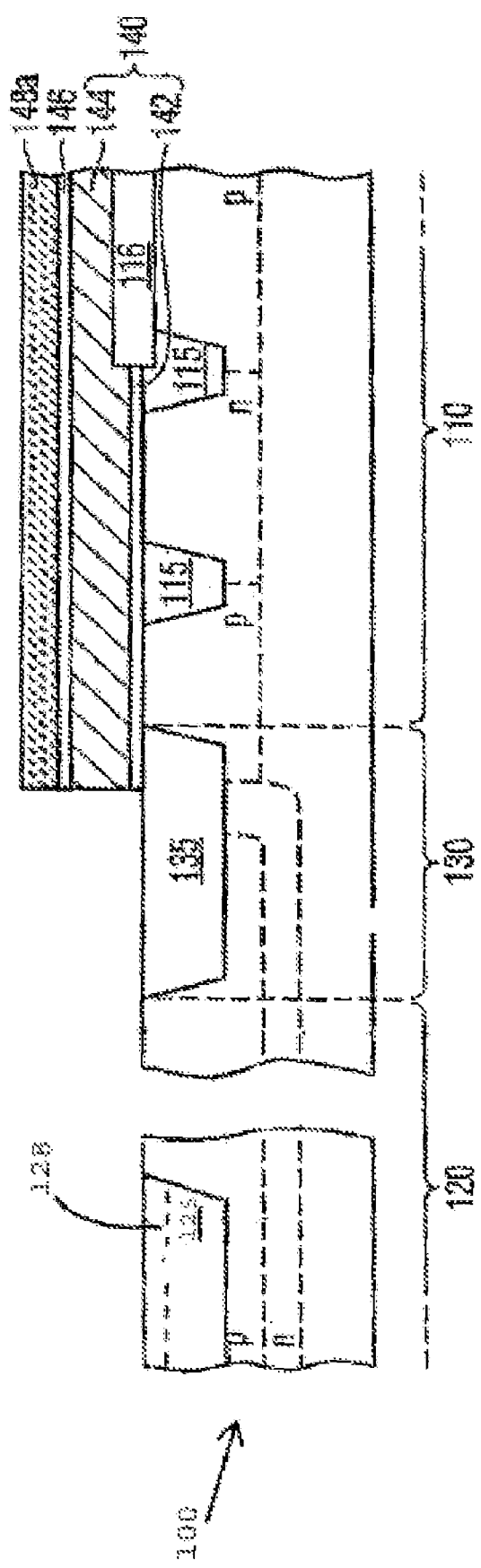

According to FIG. 1B, the pattern of the first block mask 191 may be transferred into the first hard mask layer 148 to form a first hard mask 148a, the first etch stop liner 146 and the first gate conductor stack 144, for example by a dry etch that stops in the gate dielectric 142, to form the first gate stack 140. The first block mask 191 may be stripped, for example, after patterning the first hard mask layer 148. Then, the exposed section of the gate dielectric 142 in the memory area 120 and in a portion of the transition area 130 adjacent to the memory area 120 may be removed, for example by a DHF (diluted HF: $H_2O$ solution) wet clean.

FIG. 1B illustrates on the right-hand side the first gate stack 140 including the gate dielectric 142 and the first gate conductor stack 144 that is covered by a first hard mask 148a, which is formed from the first hard mask layer 148a and which is separated from the first gate stack 140 by a remnant section of the first etch stop liner 146. According to an exemplary embodiment, the STIs 125 in the memory area 120 may be recessed (dashed lines at 128) such that between neighboring STI lines lamellas of the semiconductor substrate 100 may be formed that extend parallel to the cross-section. Further processes may be included to form semispherical channel devices in the memory area 120.

Figure 1C:
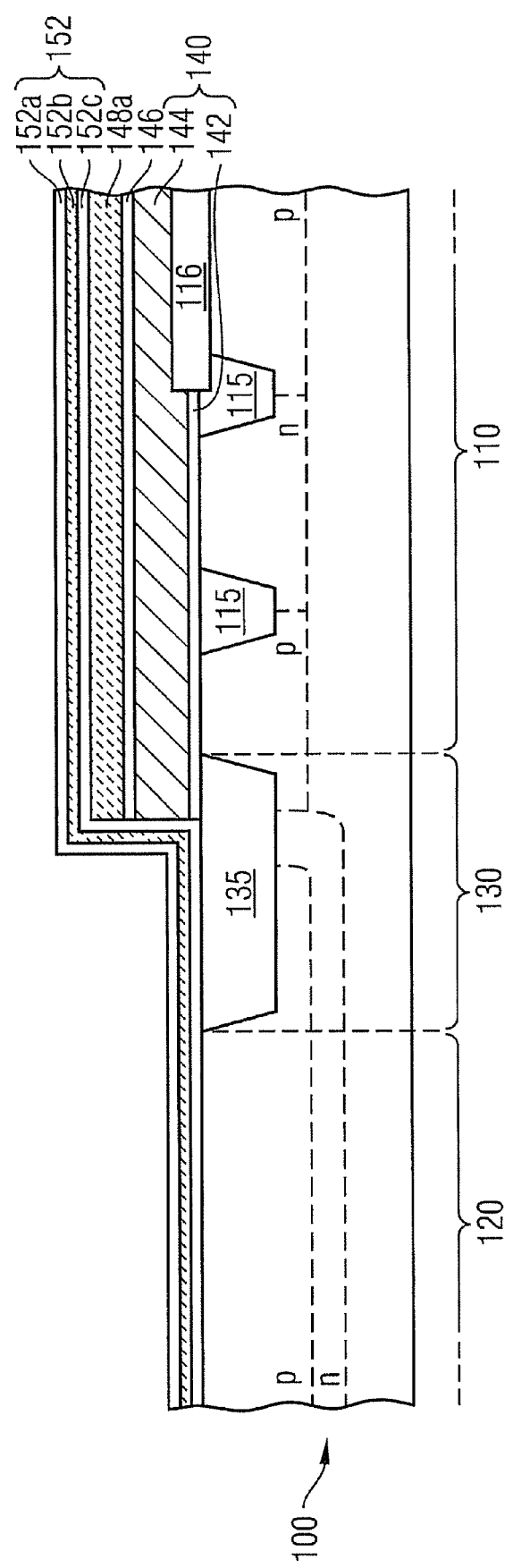

With regard to FIG. 1C, a memory layer stack 152 may be deposited on the substrate 100 in the memory area 120, on the shallow isolation trench 135 in the transition area 130 and over the first gate stack 140, wherein the first gate stack 140 may be covered with the first hard mask 148a and remnant sections of the first etch stop liner 146.

The memory layer stack 152 has a configuration that is different from that of the gate dielectric 142 of the first gate stack 140. By way of example, the memory layer stack 152 may include other sub-layers than the gate dielectric 142. In addition, the number of sub-layers or their sequence may differ from each other. The memory layer stack 152 may be a charge trapping stack including a bottom oxide 152c, a charge trapping layer 152b and a top oxide 152a. For SONOS structures, the bottom and top oxides 152c, 152a may be silicon oxide liners and the charge trapping layer 152b may be a silicon nitride liner. For TANOS structures, the bottom oxide 152c may be a silicon oxide liner, the charge trapping layer 152b may be a silicon nitride liner and the top oxide 152a may be an alumina liner. Alternatively, other combinations of charge trapping layers and insulating layers as known in the art may be provided.

FIG. 1C illustrates the memory layer stack 152 that, in the peripheral area 110, coats the first gate stack 140, which is covered by the hard mask 148a and remnant sections of the first etch stop liner 146, and that covers the substrate 100 in the memory area 120.

Figure 1D:
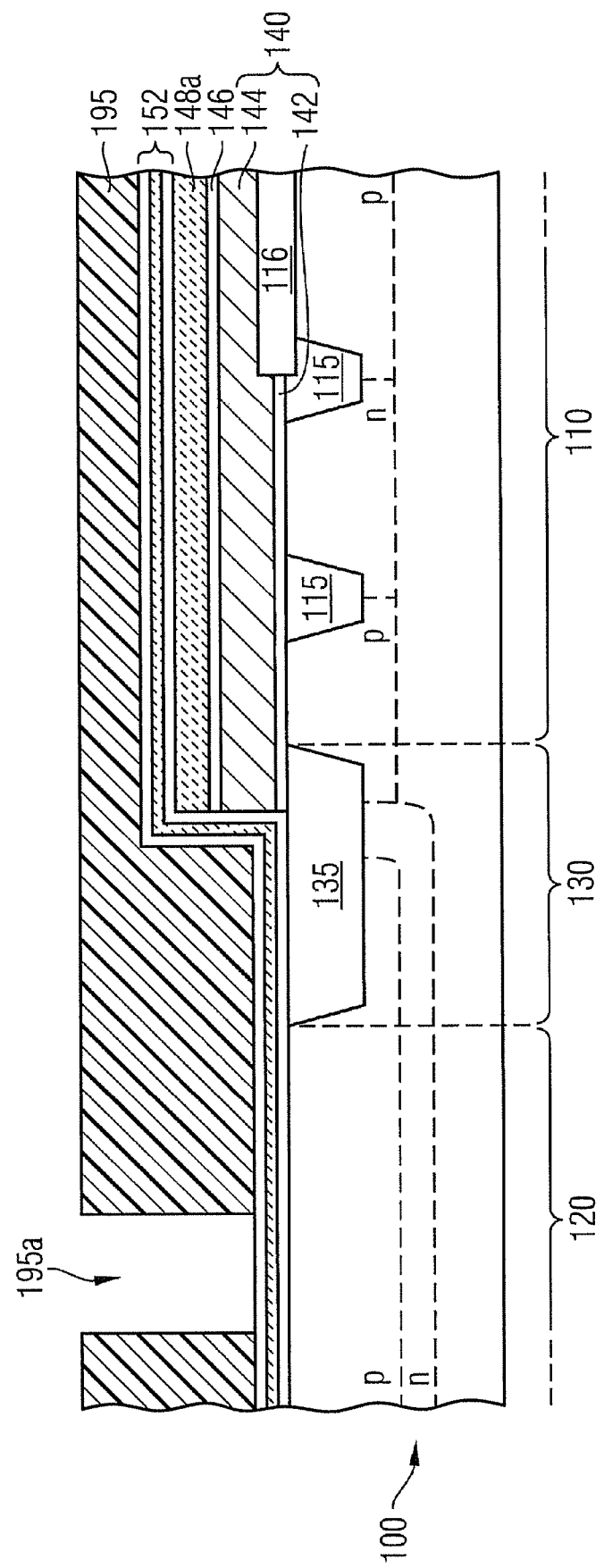

Referring to FIG. 1D, a further resist layer or resist system may be deposited and photolithographically patterned to form a select transistor mask 195. The select transistor mask 195 includes openings 195a to remove sections of the memory layer stack 152 above those sections of the memory area 120 that are assigned to select transistors which connect, for example, the corresponding NAND string to either a bit line or a source line. FIG. 1D illustrates the select transistor mask 195 including openings 195a in the memory area 120.

According to FIG. 1E, in select transistor areas within the memory area 120, the memory layer stack 152 may be removed completely or at least partially, wherein the bottom oxide 152c may be left in the select transistor areas. According to other embodiments, at least the top oxide 152a and the charge trapping layer 152b are removed. If the bottom oxide 152c is removed, a select transistor gate dielectric 153 is provided on the exposed sections of the substrate 100.

According to the example as illustrated in FIG. 1E, the memory layer stack 152 may be completely removed via a dry etch process or a sequence of different dry etch processes and a select transistor gate dielectric 153 is grown selectively on the exposed sections of the substrate 100. Though the select transistor gate dielectric 153 is illustrated as being flush with the upper edge of the memory layer stack 152, the gate dielectric 153 may also be thinner than the memory layer stack 152.

Figure 1F:
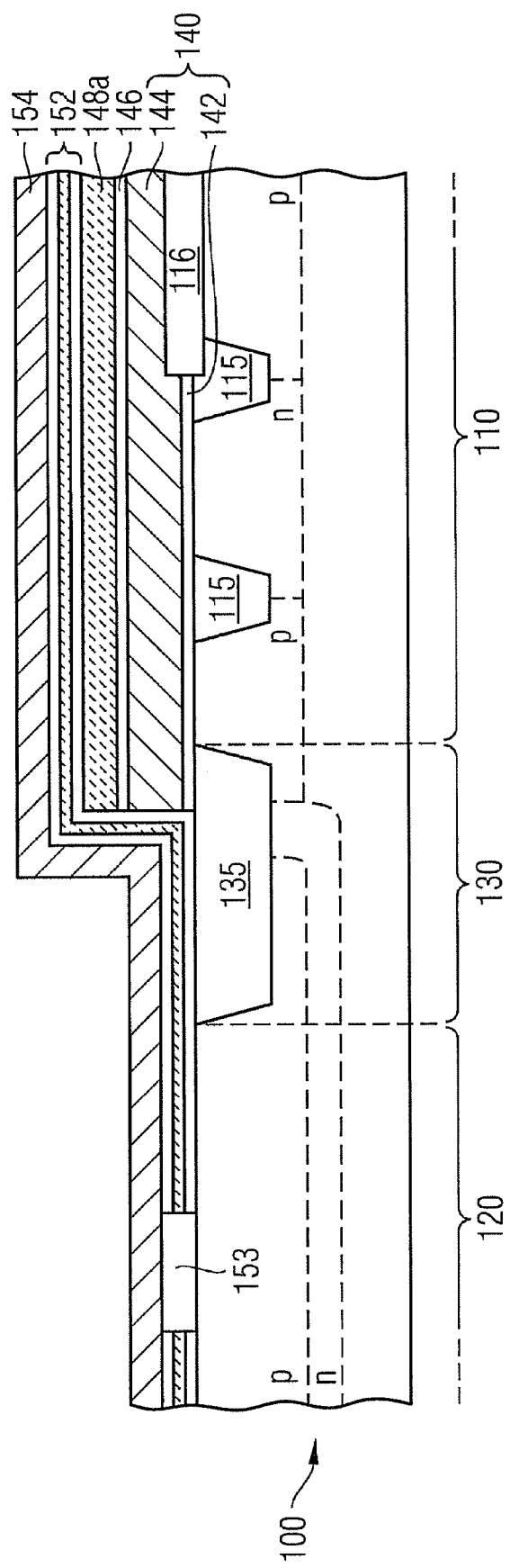

Referring to FIG. 1F, a second gate conductor stack 154 is deposited over the select transistor gate dielectric 153 and the memory layer stack 152. The second gate conductor stack 154 may consist of only one gate conductor layer as illustrated in FIG. 1F. The second gate conductor layer may be, by way of example, a heavily p-doped polysilicon layer. The second gate conductor stack 154 may include further layers, for example metal containing layers, diffusion barrier layers and adhesion layers.

FIG. 1F illustrates the second gate conductor stack 154 being deposited over the memory area 120, the transition area 130 and the peripheral area 110 and including a process in the transition area 130.

In the case of, for example, a TANOS cell structure, the memory layer stack 152 may be provided without top oxide 152a and an alumina liner may be deposited after forming the select transistor gate dielectric 153 via a conformal deposition method like ALD (atomic layer deposition). Further in case of TANOS cells, the second gate conductor stack 154 may include a tantalum nitride liner disposed on the alumina liner and a tungsten layer disposed on the tantalum nitride liner.

Figure 1G:
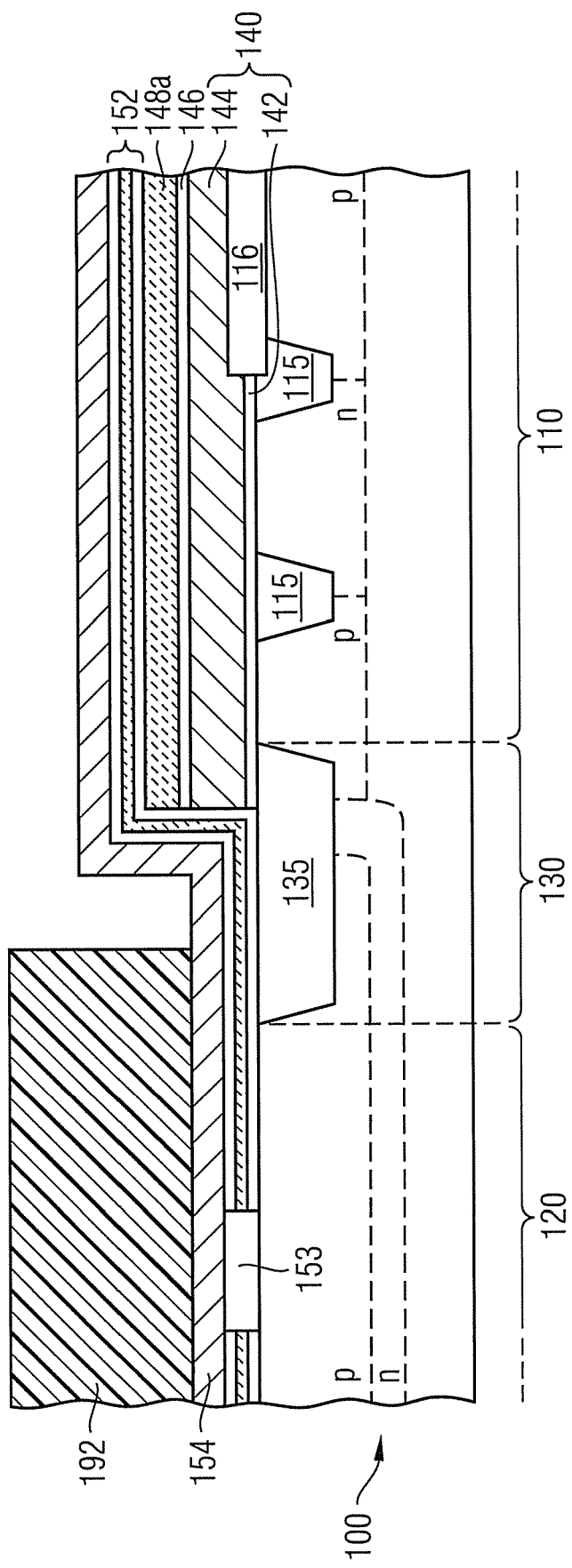

According to FIG. 1G, a further photoresist layer or layer system may be deposited over the second gate conductor stack 154 and photolithographically patterned to form a second block mask 192 covering the second gate conductor stack 154 in the memory area 120 and in a portion of the transition area 130 adjacent to the memory area 120.

Referring to FIG. 1H, the pattern of the second block mask 192 may be transferred into the second gate conductor stack 154 and the memory layer stack 152 to form the second gate stack 150, wherein a dry etch may be used that stops selectively on remnant portions of the hard mask 148a in the peripheral area 110 and on the shallow trench isolation 135 in the transition area 130.

As illustrated in FIG. 1H, the second gate stack 150 covers a section of the main surface 101 in the memory area 120, while the first gate stack 140 covers a section of the main surface 101 in the peripheral area 110. Both the first gate stack 140 and the second gate stack 150 may extend into neighboring sections of the transition area 130. The first gate stack 140 may still be covered by a bi-layer including the hard mask 148a and remnant sections of the first etch stop liner 146.

Figure 1I:
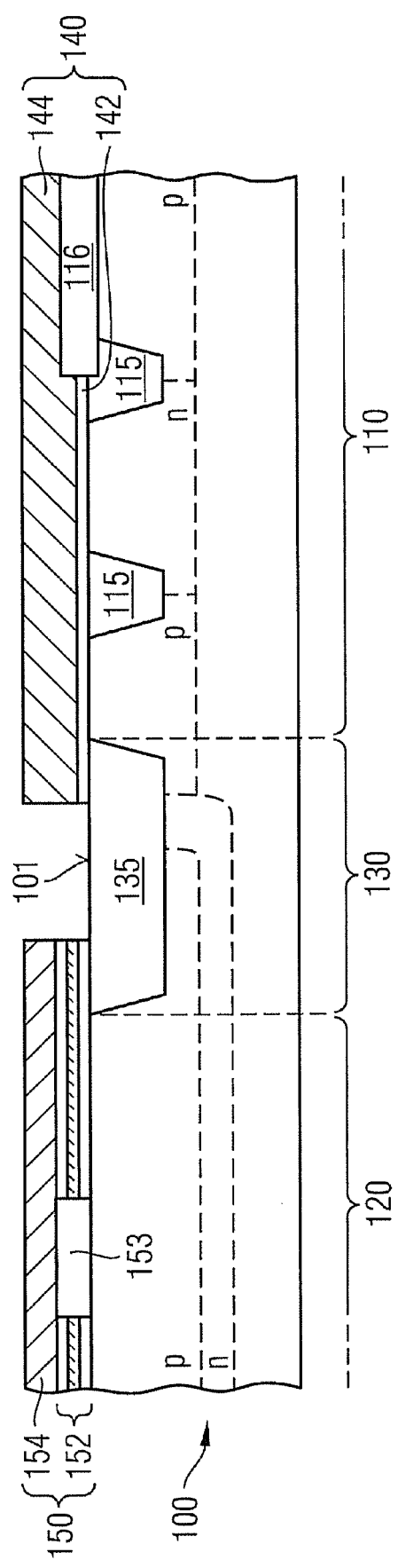

With regard to FIG. 1I, the first hard mask 148a and the remnant sections of the first etch stop liner 146 may be removed selectively against the first and second gate conductor stack 154, 144, for example through a wet etch.

FIG. 1I illustrates the first gate stack 140 in the peripheral area 110 after the preceding wet etch. The first gate stack 140 covers a first surface section of the main surface 101 in the peripheral area 110 and the second gate stack 150 covers a second surface section of the main surface 101 in the memory area 120. Both gate stacks 140, 150 may extend into the transition area 130. The height of the two gate stacks may be matched to each other such that their upper edges are flush. Between the two gate stacks 150, 140, a gap may be formed in the transition area 130 over the shallow trench isolation 135. In areas assigned to the select transistors, the memory layer stack 152 may be replaced by the select transistor gate dielectric 153 as described above. The upper edge of the select transistor gate dielectric 153 is not necessarily flush with the upper edge of the memory layer stack 152. In SONOS cells, the memory layer stack 152 may be an oxide-nitride-oxide stack. In TANOS cells, the memory layer stack 152 may be an alumina-nitride-oxide stack. Further for TANOS cells, the gate conductor stack 154 may include a tantalum nitride liner, which is in contact with the alumina liner of the memory layer stack 152 and a tungsten layer deposited on the tantalum nitride liner. For SONOS cells, the gate conductor stack 154 may be one heavily p-doped polysilicon layer.

According to the embodiment illustrated in FIGS. 1A to 1L, first the first gate stack 140 and then the second gate stack 150 is provided. According to other embodiments, the order may be inverted and at first the second gate stack 150 may be provided above the memory area 120 and then the first gate stack 140 may be provided above the peripheral area 110.

Referring to FIG. 1J, the gap between the first and the second gate stack 140, 150 in the transition area 130 may be at least partially filled with an insulator fill 136. According to an embodiment, a silicon dioxide layer may be deposited to fill the gap between the gate stacks 140, 150. The silicon dioxide layer may be recessed by a dry etch, wherein the gate conductor stacks 144, 154 may be effective as etch stop layers.

FIG. 1J illustrates a silicon dioxide insulator fill 136, which may be slightly overetched. The insulator fill 136 reduces the topology and process height in the transition area 130.

According to another embodiment, a CMP stop liner may be deposited that lines the gate stacks 140, 150. The CMP stop liner may be, for example a silicon nitride liner. A silicon oxide may be deposited on the CMP stop liner to fill the gap between the gate stacks 140, 150. A CMP (chemical-mechanical polishing) process may be performed that stops on the CMP stop liner.

With regard to FIG. 1K, a shared conductive layer stack 160 may be deposited on the first and second gate stacks 140, 150 and the optional insulator fill 136. The shared conductive layer stack 160 may include a single tungsten layer or tungsten silicide or other silicides which are formed by metal deposition and subsequent anneal or a layer system including, for example, a highly conductive material, adhesion and diffusion barrier layers. A second hard mask layer 170 may be provided on or above the shared conductive layer stack 160.

FIG. 1K illustrates the shared conductive layer stack 160 covering the first and the second gate stack 140, 150, and the insulator fill 136. The second hard mask layer 170 covers the shared conductive layer stack 160, which may include or consist of tungsten.

Referring to FIG. 1L, a further photoresist layer may be deposited on the second hard mask layer 170 and may be patterned by photolithographic techniques to form a GC (gate conductor) resist mask. The pattern of the GC resist mask which includes a first pattern in the peripheral area 110 and a second pattern, which is different from the first pattern, in the memory area 120 is transferred into the second hard mask layer 170 to form a GC hard mask 170a. The GC resist mask may be stripped and the pattern of the GC hard mask 170a is transferred into the underlying structures including the first gate stack 140 in the peripheral area 110 and the second gate stack 150 in the memory area 120 and the shared conductive layer stack 160 extending over the first and the second gate stack 140, 150.

Patterning of the GC hard mask 170a may be performed using a single GC resist mask as described above or through a double exposure technique using two or more resist masks, pitch fragmentation methods or a double patterning technique with additional hard masks. By adjusting the heights of the first and the second gate stacks 140, 150, the shared conductive layer stack 160 may have the same thickness in the peripheral area 110 and the memory area 120 such that the etch requirements in the peripheral area 110 may be matched at least partly with that of the memory area 120.

As illustrated in FIG. 1L, the etch of the corresponding layers in the first and the second gate stack 140, 150 may be performed simultaneously, for example if the thicknesses of the respective layers are essentially the same or if the etch stops in the same material both in the peripheral area 110 and the memory area 120.

If the etch parameters of equivalent layers in the first and the second gate stack 140, 150 differ substantially from each other, one of the memory area 120 and peripheral area 110 may be covered with an additional block mask and the etch may be effective only in the exposed section, which may be the memory or the peripheral area 120, 110. Examples for the latter are described in the following with regard to FIGS. 3 and 4.

The process, which FIG. 2 refers to, may follow the formation of two gate stacks according to FIGS. 1A to 1I. Providing an insulator fill 153 as described with reference to FIG. 1J may be omitted and alternatively a shared conductive layer stack 260 may be deposited on the first and the second gate stack 240, 250 and a GC hard mask layer 270 may be deposited on the shared conductive layer stack 260. The topology in the transition area 230 may be reduced via a subsequent deposition of an auxiliary layer, for example an oxide, filling a remaining gap between the first and the second gate stack 240, 250, and a CMP process that stops on the GC hard mask layer 270. An oxide fill 273 may then fill the remaining gap in the transition area 230. The CMP process planarizes the surface of the GC hard mask layer 270. The planarized surface may facilitate the following lithographic process transferring a GC photoresist mask pattern into the GC hard mask layer 270 as described with reference to FIG. 1L.

Figure 3B:
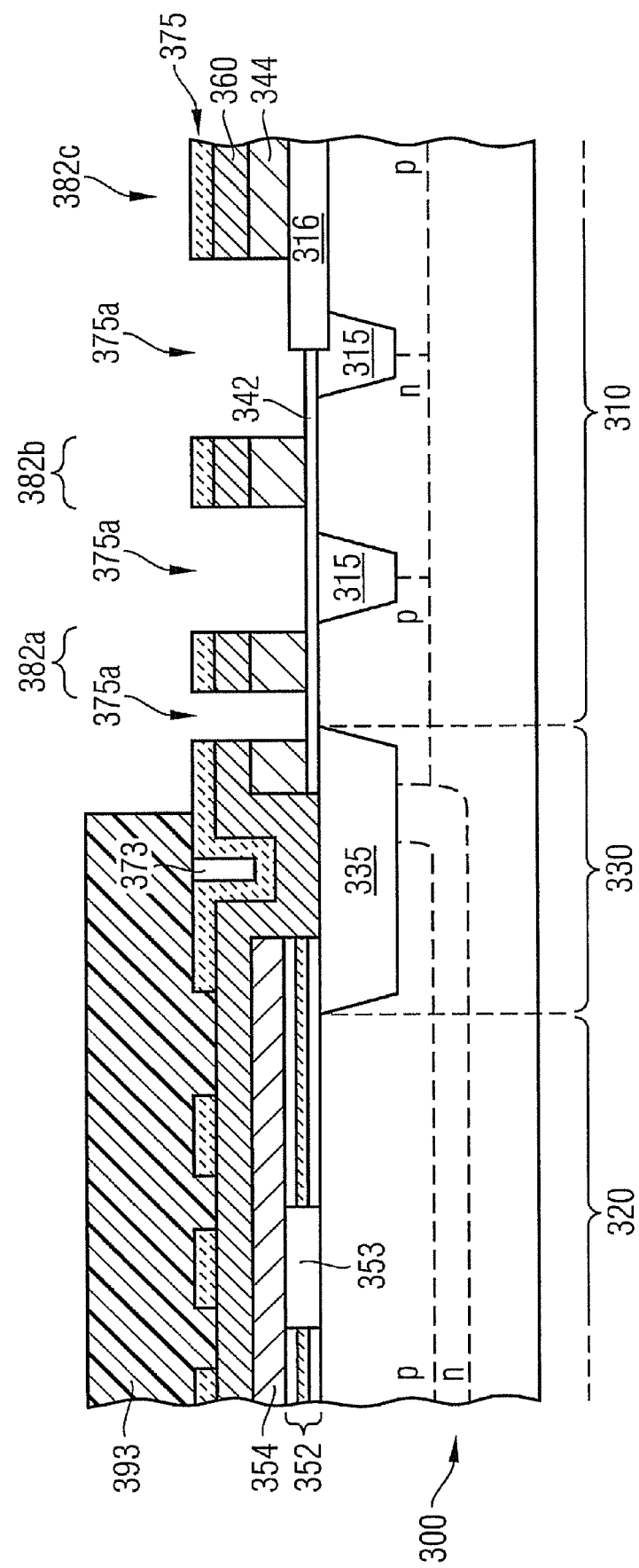

FIGS. 3A to 3D refer to an embodiment with the first gate stack 340 and the second gate stack 350 being patterned successively and may follow, by way of example, a process flow described with reference to FIG. 1A to 1I and FIG. 2. Via photolithographic techniques, a GC hard mask 375 may result from transferring a GC resist pattern into a GC hard mask layer, which may correspond to the GC hard mask layer 270 of FIG. 2. As illustrated in FIG. 3A, the GC hard mask 375 has first openings 375a in the peripheral area 310 and second openings 375b in the memory area 320. The first and second openings 375a, 375b may be formed simultaneously to reduce alignment requirements. The formation is independent from the material utilized in the gate stacks 140, 150, such that the same masks may be used for different cell materials.

Referring to FIG. 3B, a third block mask 393 may be formed that covers the memory area 320 and that may extend into neighboring sections of the transition area 330. Using the third block mask 393 and the GC hard mask 375 as combined etch mask, the first openings 375a may be transferred into a peripheral gate stack including the first gate conductor stack 344 and the shared conductive layer stack 360. The etch, which is, for example, a dry etch, may stop in the gate dielectric 342.

FIG. 3B illustrates an n-MOSFET region 382a, a p-MOSFET region 382b and a gate wiring line 382c resulting from the preceding etch. Each MOSFET 382a, 382b includes a gate conductor formed from the first gate conductor stack 344, the gate dielectric 342 and an active area between neighboring shallow isolation trenches 315.

With regard to FIG. 3C, a fourth block mask 394 may be formed that covers the peripheral area 310 and adjacent portions of the transition area 330. Using the fourth block mask 394 and the GC hard mask 375 in the memory area 320 as a combined etch mask, for example for a dry etch, the second openings 375b may be transferred into the memory gate stack including at least a portion of the memory layer stack 352, the second gate conductor stack 354 and the shared conductive layer stack 360. The first and the second gate stacks 340, 350 according to FIG. 3A are etched independently from each other facilitating the adjustment of etch parameters, wherein the formation of the GC hard mask of both the peripheral area 110 and the memory area 320 is performed simultaneously.

FIG. 3C illustrates memory cells 382c and select transistors 382d resulting from the preceding etch processes. The etch may stop in the bottom oxide 352c. The arrangement of the memory cells 382c and select transistors 382d in the memory area 320 as illustrated in FIG. 3C is for illustrating the principles only. Usually, several memory cells 382c are arranged to form a line or string and one select transistor 382d is arranged at each end of the string. One string of memory cells and two select transistors assigned to the memory cells form, for example a NAND string that is separated from neighboring NAND strings by shallow isolation structures that extend parallel to the cross-section plane before and behind the cross-sectional plane. The integration scheme may further apply to other architectures known for non-volatile memories, for example for AND-arrays.

With reference to FIG. 3D, the fourth block mask 394 may be removed to form the structure as illustrated in FIG. 3D. Then, the formation of sidewall oxides, low doped drain implants, the formation of spacer structures, further S/D implants, and the formation of contact and wiring layers may follow. The order of patterning the first gate stack and the second gate stack may be inverted such that at first the second gate stack 350 and then the first gate stack 340 is patterned.

As illustrated above, FIGS. 1A to 1L refer to embodiments providing a simultaneous etch of the first and the second gate stacks. The FIGS. 3A to 3D refer to embodiments wherein first one of the gate stacks and then the other gate stack is patterned. The embodiments according to FIGS. 4A to 4E refer to embodiments including both shared etch processes being effective on both gate stacks and selective etch processes that are effective either on the first or on the second gate stack.

The structure as illustrated in FIG. 4A may emerge from a process as described with reference to FIGS. 1A to 1I and FIG. 2. The shared conductive layer stack 460 may be a tungsten layer. The first gate conductor stack 444 may include a polysilicon layer and the gate dielectric 442 may be a silicon oxide. The second gate conductor stack 454 may be a tantalum nitride layer and the memory layer stack 452 may include an alumina liner as top oxide. The stack heights of the first and second gate stacks may be matched such that their upper edges are flush to each other. In a first etch process, a dry etch may be performed that uses the GC hard mask 475 as an etch mask, wherein the dry etch stops in the gate dielectric 442 in the peripheral area 410 and in the alumina liner 452a in the memory area 420.

FIG. 4A illustrates first openings 475a in the peripheral area 410 that extend down to the gate dielectric 442 and second openings 475b that extend down to the alumina liner 452c and the select transistor gate dielectric 453 in the memory area 420.

Figure 4B:
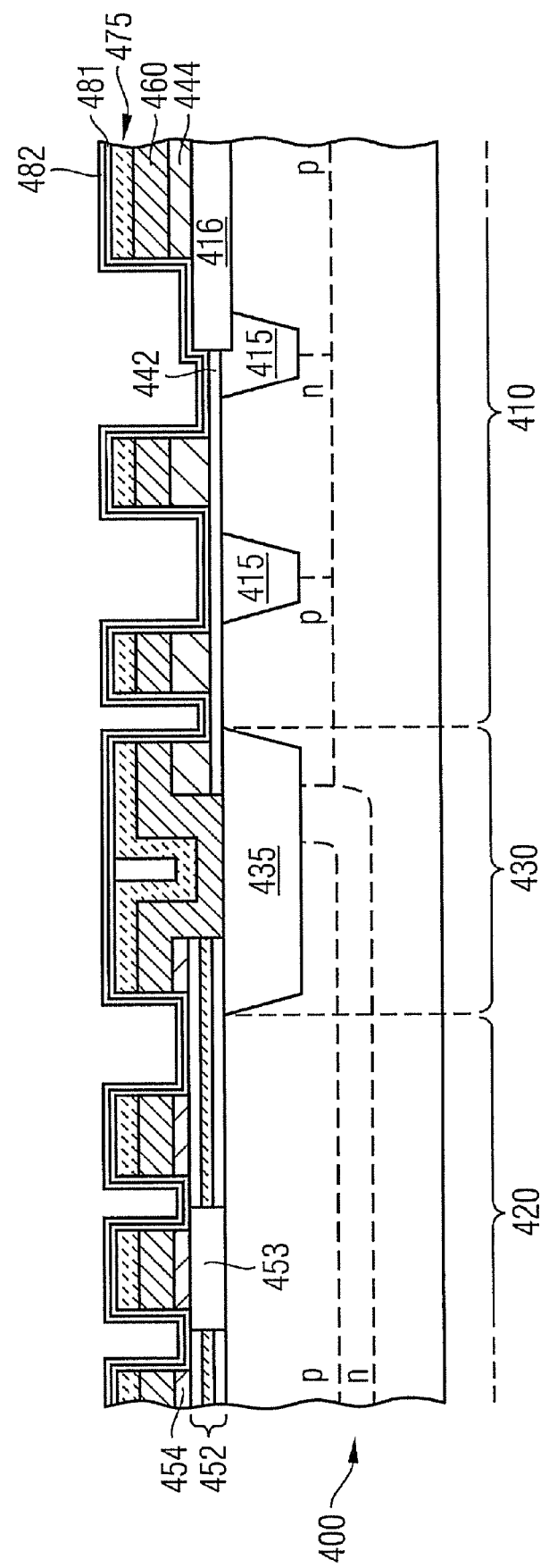

With regard to FIG. 4B, a conformal second etch stop liner 482 may be provided above the topology as illustrated in FIG. 4A. The second etch stop liner 482 may be a silicon nitride liner with a thickness of about 7 nm. A buffer liner 481 may be deposited on the topology before the second etch stop liner 482 to facilitate the removal of the second etch stop liner 482. The buffer liner 481 may be a silicon oxide liner. According to an embodiment, the buffer liner 481 may have a thickness of about 5 nm and may form a sidewall oxide in the peripheral area 410. FIG. 4B illustrates the prepatterned first and second gate stacks covered with the conformal buffer liner 481. The second etch stop liner 482 covers the buffer liner 481.

Figure 4C:
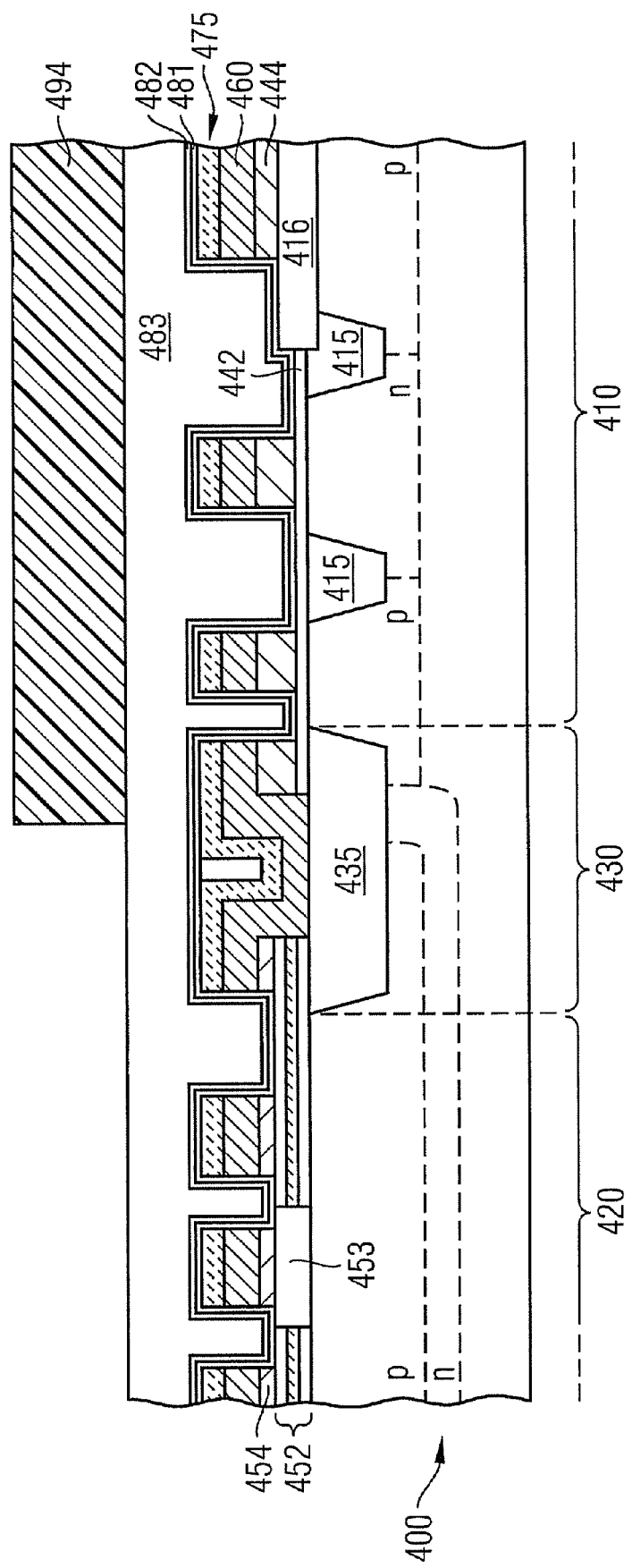

With regard to FIG. 4C, a thick buffer oxide liner 483, the thickness of which depends on the selectivity of an alumina etch process performed later in the process, for example of a thickness of 50 nm, is deposited on the second etch stop liner 482. A fourth block mask 494 may be provided via photolithographic techniques on the thick buffer oxide liner 483 in the peripheral area 410 and adjacent sections of the transition area 430. FIG. 4C illustrates the fourth block mask 494 covering the peripheral area 410 completely and further a section of the transition area 430, which is adjacent to the peripheral area 410.

Figure 4D:
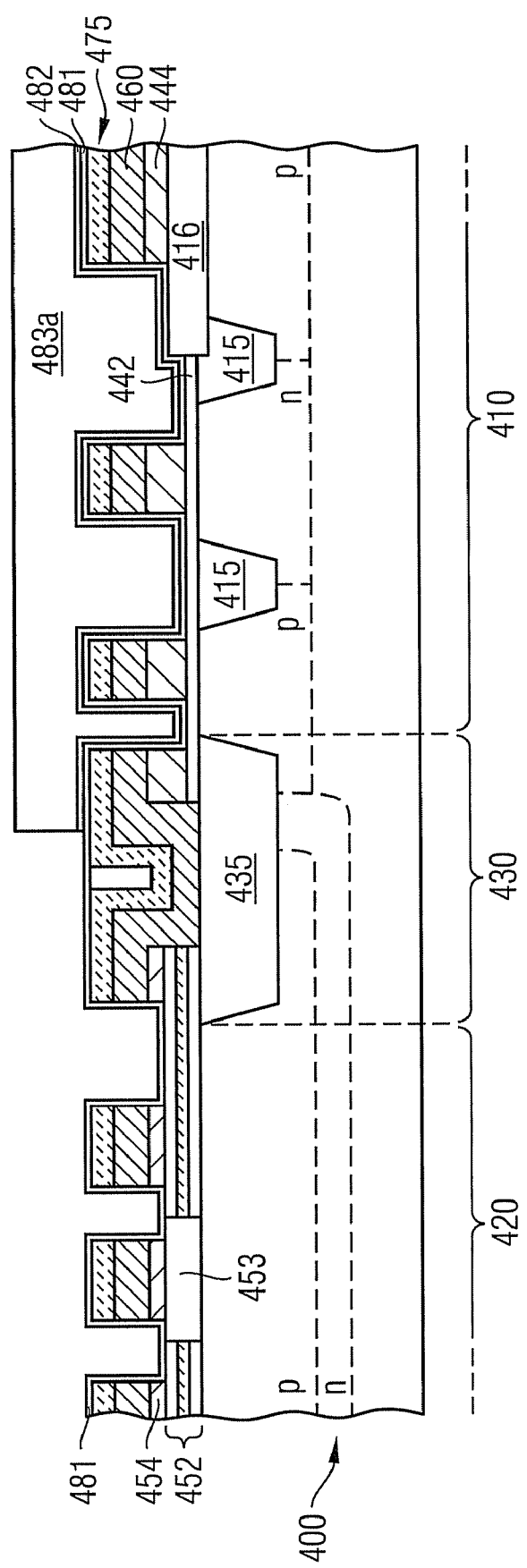

Referring to FIG. 4D, the exposed section of the thick buffer oxide liner 483 is removed, for example via a BHF clean. The exposed section of the second etch stop liner 482 in the memory area 420 and in adjacent sections of the transition area 430 may be removed selectively to the thin buffer liner 481, for example through a wet etch using hot $H_3PO_4$ or a selective reactive ion etching (RIE).

FIG. 4D illustrates a remnant section of the thick buffer oxide liner 483a covering the peripheral area 410 and adjacent sections of the transition area 430. In the memory area 420 and adjacent sections of the transition area 430, the thin buffer liner 481 covers the prepatterned second gate stacks.

Figure 4E:
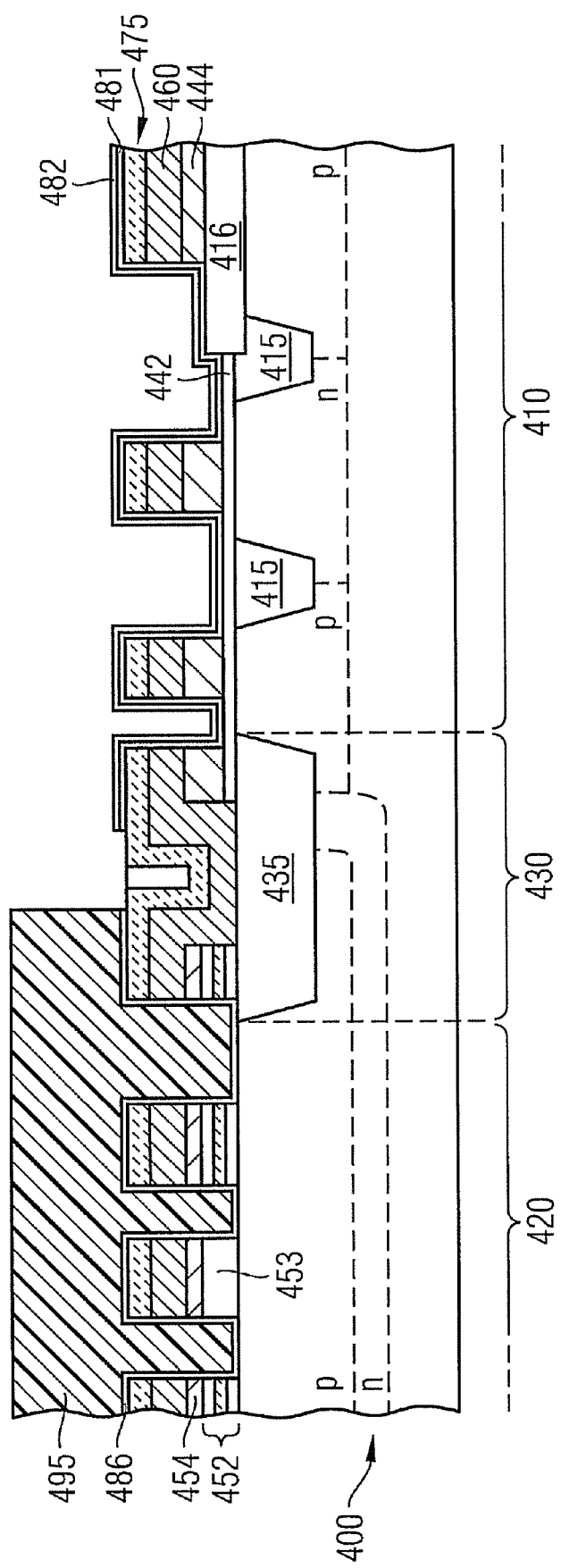

With reference to FIG. 4E, the thin buffer liner 481 in the memory area 420 may be removed, for example through an anisotropic oxide etch. Then an etch may be performed that is effective on the alumina liner of the memory layer stack 452 and the thick buffer oxide liner 483a, wherein the thickness of the thick buffer oxide liner 483a is sufficient to mask the peripheral area 410. After the etch of the memory layer stack 452 in the memory area 420, a cleaning process may be performed. According to other embodiments, a sidewall oxide liner of, for example 5 nm may be deposited which forms a sidewall oxide 486 in the memory area 420. A fifth block mask 495 may be formed that covers the memory area 420 and adjacent sections of the transition area 430. Using the fifth block mask 495, the thick buffer oxide liner 483a in the peripheral area 410 may be removed via a BHF clean.

FIG. 4E illustrates the fifth block mask 495 covering the second gate stacks in the memory area 420. A sidewall oxide 486 is formed that covers the second gate stacks. In the peripheral area 410, the thick buffer oxide liner 483a is removed and the second etch stop liner 482 exposed.

In the following, the fifth block mask 495, which may be a resist block mask, may be removed by a resist strip and the remaining remnant section of the second etch stop liner 482 in the peripheral area 410 may be removed. The formation of low doped drain regions, sidewall spacer structures, source/drain implant regions, contact and wiring layers may follow.

Figure 5:
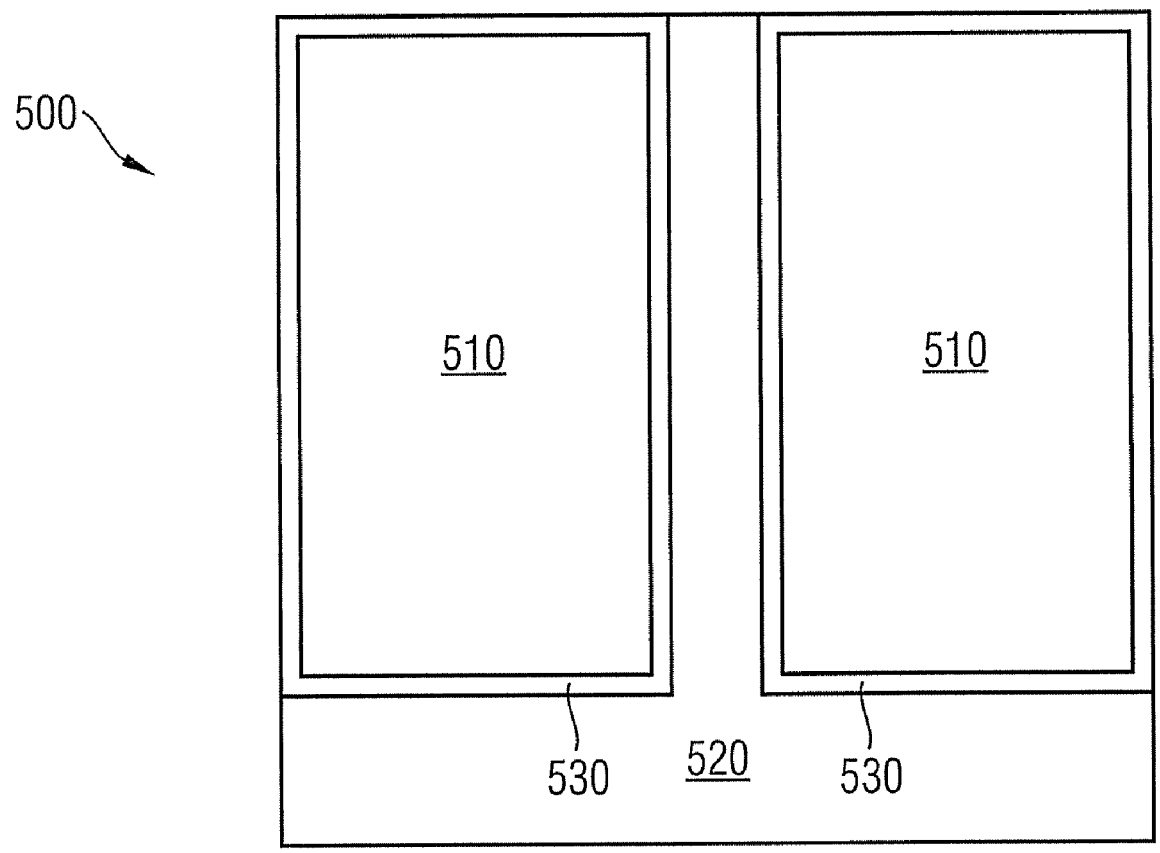
FIG. 5 illustrate a schematic top view of a section of an integrated circuit including two memory areas and a peripheral area according to another embodiment.

FIG. 5 is a top view of a section of an integrated circuit 500 including NAND arrays in memory areas 510 and a peripheral area 520. Transition areas 530 surround each memory area 510 separating them from the peripheral area 520. The transition areas 530 comprise, in sections adjacent to the memory areas 510, first dummy gate lines with the structure of the memory gate stack and, adjacent to the peripheral area 520, second dummy gate lines with the peripheral gate structure. A gap between the different types of dummy gate lines may be filled with an insulating fill or with sections of a shared conductive layer stack. The width of the transition area 530 may be in the range from a few 100 nm up to a few micrometers, for example 1 micrometer.

FIG. 6 is a simplified flow chart of a method of manufacturing an integrated circuit according to one embodiment. A first layer stack is provided on a first surface section of a main surface of a semiconductor substrate and a second layer stack is provided on a second surface section (602). A hard mask is provided on the first and second layer stack, wherein the hard mask includes a first pattern above the first layer stack and a second pattern above the second layer stack (604). The first pattern is transferred into the first gate stack and the second pattern into the second gate stack (606).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an integrated circuit including non-volatile memory cells, comprising:
   providing a first gate stack comprising a gate dielectric on a first surface section of a main surface of a semiconductor substrate, wherein providing the first gate stack comprises depositing a first non-patterned gate stack on the main surface;
   providing a second gate stack comprising a memory layer stack on a second surface section, wherein a configuration of the memory layer stack differs from that of the gate dielectric, and wherein providing the second gate stack on the second surface section comprises:
      depositing a second non-patterned gate stack on the second surface section and the first gate stack;
      covering a section of the second non-patterned gate stack above the second surface section with a first block mask; and
      removing an exposed section of the second non-patterned gate stack to form the second gate stack;
   providing a hard mask over the first and second gate stacks, the hard mask comprising a first pattern above the first gate stack and a second pattern above the second gate stack; and
   transferring the first pattern into the first gate stack and the second pattern into the second gate stack, wherein sections of the main surface are exposed.

2. The method of claim 1, wherein providing the first gate stack comprises:
   covering a section of the first non-patterned gate stack above the first surface section with a second block mask; and
   removing an exposed section of the first non-patterned gate stack to form the first gate stack.

3. The method of claim 1, further comprising, before providing the first gate stack,
   defining stripe shaped active areas of transistor-based memory cells in the second surface section, wherein neighboring active areas are separated by shallow trench isolations; and
   recessing the shallow trench isolations and/or reshaping the active areas after forming the first gate stack and prior to depositing the second non-patterned gate stack.

4. The method of claim 1, further comprising, before providing the hard mask,
   depositing a shared conductive layer stack on the first and second gate stacks; wherein
   transferring the first pattern into the first gate stack comprises transferring the first pattern into a first section of the shared conductive layer stack; and transferring the second pattern into the second gate stack comprises transferring the second pattern into a second section of the shared conductive layer stack.

5. The method of claim 1, further comprising, before transferring the first pattern into the first gate stack, covering a mask section including the second pattern with a second block mask.

6. The method of claim 1, further comprising, before transferring the second pattern into the second gate stack, covering a mask section including the first pattern with a second block mask.

7. The method of claim 1, wherein transferring the first pattern into the first gate stack and the second pattern into the second gate stack comprises:
contemporaneously transferring the first pattern and the second pattern.

8. The method of claim 1, wherein transferring the first pattern into the first gate stack and the second pattern into the second gate stack comprises:
transferring first the first pattern; and then
transferring the second pattern.

9. The method of claim 1, wherein transferring the first pattern into the first gate stack and the second pattern into the second gate stack comprises:
transferring simultaneously the first pattern into a first gate conductor stack of the first gate stack and the second pattern into a second gate conductor stack of the second gate stack;
covering the patterned first gate conductor stack with an auxiliary etch mask;
transferring the second pattern into the memory layer stack;
covering the patterned second gate stack with a second block mask;
removing the auxiliary etch mask; and
transferring the first pattern into the gate dielectric.

10. The method of claim 9, further comprising:
depositing, before covering the patterned first gate conductor stack, an etch stop liner;
removing, before transferring the second pattern, a second section of the etch stop liner above the second gate stack; and
removing, before transferring the first pattern, a first section of the etch stop liner above the first gate stack.

11. The method of claim 1, comprising:
providing the first and the second gate stacks with a gap assigned to a transition area between the first and the second surface sections.

12. The method of claim 11, wherein, before providing the hard mask,
the gap is at least partially filled with an insulator material.

13. The method of claim 11, wherein providing the hard mask comprises:
depositing a hard mask layer;
depositing a fill layer filling a mask gap above the transition area; and
patterning the hard mask layer to form the hard mask.

14. The method of claim 1, comprising:
forming memory cells in a memory area of the substrate, the memory area corresponding to the second surface section; and
forming a CMOS circuit in a peripheral area of the substrate, the peripheral area corresponding to the first surface section.

15. The method of claim 14, wherein providing the first gate stack comprises:
providing one or more gate dielectric on the main surface; and
depositing a first polysilicon layer on the one or more gate dielectric.

16. The method of claim 14, wherein providing the second gate stack comprises:
providing the memory layer stack on the main surface; and
depositing a second polysilicon layer on the memory layer stack.

17. The method of claim 14, wherein providing the second gate stack comprises:
providing the memory layer stack on the main surface; and
depositing a metal layer on the memory layer stack.

18. The method of claim 14, further comprising:
replacing the memory layer stack with a replacement gate dielectric in sub-sections of the memory area, the sub-sections assigned to select transistors, before depositing a second polysilicon layer or a metal layer on the memory layer stack.

19. A method of manufacturing an integrated circuit including non-volatile memory cells, comprising:
providing a first non-patterned gate stack comprising a gate dielectric on a first surface section of a main surface of a semiconductor substrate to provide a first gate stack;
depositing a second non-patterned gate stack comprising a memory layer stack on a second surface section and on the first gate stack, wherein a configuration of the memory layer stack differs from that of the gate dielectric;
covering a section of the second non-patterned gate stack above the second surface section with a block mask;
removing an exposed section of the second non-patterned gate stack to form a second gate stack;
providing a hard mask over the first and second gate stacks, the hard mask comprising a first pattern above the first gate stack and a second pattern above the second gate stack; and
transferring the first pattern into the first gate stack and the second pattern into the second gate stack, wherein sections of the main surface are exposed.

* * * * *